(12) United States Patent
Roth et al.

(10) Patent No.: US 6,639,397 B2
(45) Date of Patent: Oct. 28, 2003

(54) AUTOMATIC TEST EQUIPMENT FOR TESTING A DEVICE UNDER TEST

(75) Inventors: Bernhard Roth, Boeblingen (DE); Henriette Ossoinig, Stuttgart (DE)

(73) Assignee: Agilent Technologies, Inc., Palo Alto, CA (US)

( * ) Notice: Subject to any disclaimer, the term of this patent is extended or adjusted under 35 U.S.C. 154(b) by 8 days.

(21) Appl. No.: 09/999,315

(22) Filed: Oct. 31, 2001

(65) Prior Publication Data

US 2002/0125896 A1 Sep. 12, 2002

(30) Foreign Application Priority Data

Mar. 10, 2001 (EP) .............................. 01105970

(51) Int. Cl.$^7$ .......................... G01R 1/04; G01R 31/02; H01H 31/02
(52) U.S. Cl. .................... 324/158.1; 324/537; 324/763; 324/73.1
(58) Field of Search .............................. 324/555, 158.1, 324/537, 763, 73.1; 327/68, 494; 714/736; 361/86

(56) References Cited

U.S. PATENT DOCUMENTS

| | | | |
|---|---|---|---|
| 4,646,299 A | * | 2/1987 | Schinabeck et al. ........ 714/736 |
| 5,010,297 A | | 4/1991 | Babcock ..................... 324/763 |
| 5,089,720 A | * | 2/1992 | Gloaguen .................... 307/353 |
| 5,101,153 A | | 3/1992 | Morong, III ................. 324/537 |
| 5,200,696 A | * | 4/1993 | Menis et al. .............. 324/158.1 |
| 5,521,493 A | | 5/1996 | Persons .................... 324/158.1 |
| 6,016,566 A | | 1/2000 | Yoshida ....................... 714/736 |
| 6,020,752 A | * | 2/2000 | Shimasaki .................. 324/765 |
| 6,211,723 B1 | * | 4/2001 | Creek .......................... 327/494 |
| 6,275,023 B1 | * | 8/2001 | Oosaki et al. ............ 324/158.1 |
| 6,292,342 B1 | * | 9/2001 | Miyamoto ..................... 361/86 |
| 6,313,657 B1 | * | 11/2001 | Hashimoto .................. 324/763 |

FOREIGN PATENT DOCUMENTS

WO   WO 99/52203   10/1999

\* cited by examiner

*Primary Examiner*—Andrew H. Hirshfeld
*Assistant Examiner*—Wasseem H. Hamdan

(57) ABSTRACT

An electronic circuit for automatic test equipment for testing a device under test includes two lines for connecting the circuit with a device under test. Two comparators are provided, one input of each of the comparators being connected to different ones of the two lines. A further comparator is provided, the two inputs of the further comparator being connected to different ones of the two lines. Each of the two lines is terminated. Switching elements are provided which are connected between the two lines. The switching elements enable the circuit to be used in different modes, in particular with a single-ended termination and with a differential termination.

10 Claims, 2 Drawing Sheets

AUTOMATIC TEST EQUIPMENT FOR TESTING A DEVICE UNDER TEST

BACKGROUND OF THE INVENTION

1. Field of the Invention

The invention relates to an electronic circuit for automatic test equipment for testing a device under test.

2. Discussion of the Background Art

Automatic test equipment is generally known and widely used for testing a variety of different electronic devices. The test equipment comprises a so-called pin-electronic circuit for generating input signals to the device under test. This circuit also has to represent a correct termination for the device under test and, finally, must be capable to analyze the response signals from the device under test.

As a first possibility, the device under test may have one physical signal line for any one of the logical signals. This case is called single-ended. In this case, the pin-electronic circuit may be terminated e.g. via a resistor to a programmable voltage.

As a second possibility, the device under test has differential output signals, i.e. two lines per signal. In this case, the pin-electronic circuit may be terminated with one resistor at each line of the differential signal wherein the two resistors of the two lines are programmed to the same voltage. This is called a differential signal operation with single-ended termination. As well, the pin-electronic circuit may be terminated with one resistor between both lines of the differential signal. This is called a differential signal operation with differential termination.

Due to these different possibilities, different pin-electronic circuits and therefore different automatic test equipments are necessary for testing the different devices under test. This results in increased efforts and costs.

SUMMARY OF THE INVENTION

The invention provides improved automatic test equipment, which requires less efforts and costs by utilizing an electronic circuit for the automatic test equipment according to claim 1.

The invention provides the advantage that one and the same circuit may be used for an independent single-ended termination of any of the lines of the device under test, for a differential signal operation with single-ended termination and for a differential signal operation with differential termination. As a result, one and the same circuit may be used for different devices under test. Or in other words: It is not necessary anymore to provide different circuits for these different devices under test. The effort and the costs in connection with the automatic test equipment are therefore reduced.

In an embodiment of the invention according to claim 2, a diode bridge is used to switch between the different modes of the electronic circuit according to the invention. This diode bridge has the advantage that the automatic test equipment may be implemented for high-frequency applications because it can be made on one semiconductor chip, which minimizes physical distances.

Further embodiments of the invention are provided in the other dependent claims.

DETAILED DESCRIPTION OF AN EMBODIMENT OF THE INVENTION

Figure 1:
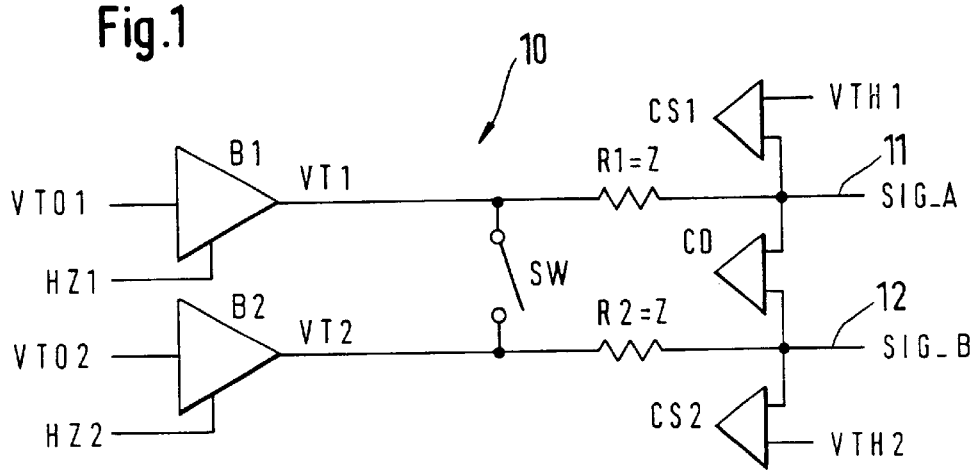
FIG. 1 shows a first embodiment of an electronic circuit for an automatic test equipment according to the invention.

In FIG. 1, a first embodiment of a pin-electronic circuit 10 for an automatic test equipment according to the invention is shown.

A signal SIG_A from a device under test is received by the circuit 10 on a line 11 and a signal SIG_B from the same device under test is received by the circuit 10 on a line 12. One input of a comparator CS1 is connected to the line 11 and one input of a comparator CS2 is connected to the line 12. The respective other inputs of the comparators CS1, CS2 receive a voltage VTH1, VTH2. The two inputs of another comparator CD are connected to the two lines 11, 12.

Each of the two lines 11, 12 are also connected to a resistor R1, R2 which both have the impedance Z of each of the transmission lines from the device under test to the circuit 10. The other sides of two resistors R1, R2 are then connected together via a switch SW.

Two buffers B1, B2 generate voltages VT1, VT2 at their outputs. The value of these voltages VT1, VT2 may be varied b voltages VT01, VT02 at the inputs of the buffers B1, B2. The outputs of the buffers B1, B2 are connected to the resistors R1, R2 at both sides of the switch SW. The voltages VT1, VT2 of the buffers B1, B2, therefore, constitute respective terminations for the two lines 11, 12.

If the signals SIG_A, SIG_B on the lines 11, 12 do not require any termination, then the buffers B1, B2 may be switched into a high-impedance state with the signals HZ1, HZ2.

If the switch SW is open as show in FIG. 1, the circuit 10 of FIG. 1 provides a single-ended termination for the lines 11, 12. The line 11 and the line 12 are independent of each other. E.g. the line 11 may be terminated with the voltage VT1 by the buffer B1. Then, the signal SIG_A of the line 11 may be compared with the voltage VTH1 by the comparator CS1. At the same time, the buffer B2 may be switched into a high-impedance state and the signal SIG_B of the line 12 may be compared with the voltage VTH2 by the comparator CS2. In this case, the comparator CD is inactive.

If the switch SW is open as shown in FIG. 1 and if the input voltages VT01, VT02 of the two buffers B1, B2 are selected such that the output voltages VT1, VT2 of the buffers B1, B2 are identical, then the circuit 10 of FIG. 1 provides a differential signal operation with a single-ended termination. In one embodiment, the two comparators CS1, CS2 are inactive and the two signals SIG_A, SIG_B are compared by the comparator CD. In another embodiment, the comparison may be performed by the two comparators CS1, CS2 with the comparator CD being inactive.

If the switch SW is closed and if the two buffers B1, B2 are put into their high-impedance state, the circuit 10 of FIG. 1 provides a differential signal operation with a differential termination. In this case, the two comparators CS1, CS2 are inactive and the two signals SIG_A, SIG_B are compared by the comparator CD.

Figure 2:
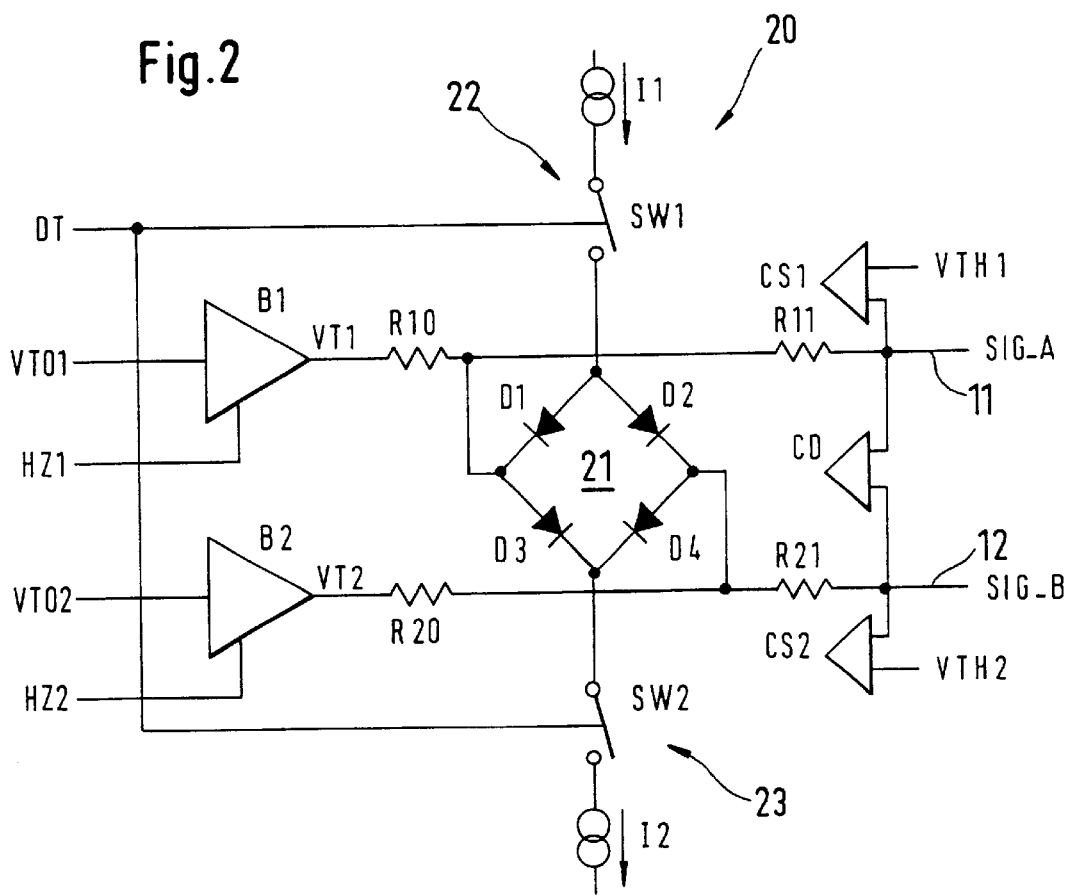
FIG. 2 shows a second embodiment of an electronic circuit according to the invention.

FIG. 2 shows a second embodiment of a pin-electronic circuit 20 of an automatic test equipment according to the invention. The circuit 20 of FIG. 2 is similar to the circuit 10 of FIG. 1. Therefore, corresponding features are depicted with the same reference characters.

In FIG. 2, the switch SW of FIG. 1 is replaced by a diode bridge 21 and two switched current sources 22, 23. The diode bridge 21 comprises four diodes D1, D2, D3, D4. A serial connection of a current source I1 and a switch SW1 is connected to the anodes of the diodes D1, D2. The cathodes of the diodes D3, D4 are connected to a serial connection of a switch SW2 and a current source I2. The cathode of the diode D1 is connected to the anode of the diode D3 and both are connected to a connection point of two resistors R10, R11. The other side of the resistor R10 is connected to the output of the buffer B1 and the other side of the resistor R11 is connected to the line 11. The cathode of the diode D2 is connected to the anode of the diode D4 and both are connected to a connection point of two resistors R20, R21. The other side of the resistor R20 is connected to the output of the buffer B2 and the other side of the resistor R21 is connected to the line 12. The two switches SW1, SW2 may be switched with the help of a common signal DT.

The diode bridge 21 is used in its resistive region so that it acts as a small resistor.

If the two buffers B1, B2 are in their low-impedance state and if the two switches SW1, SW2 are open as shown in FIG. 2 due to a low signal DT, the circuit 20 of FIG. 2 provides a single-ended termination for the two lines 11, 12. The comparators CS1, CS2 are active whereas the diode bridge 21 and the comparator CD are inactive. The termination of each of the two lines 11, 12 may be programmed differently by the input voltages VT01, VT02 of the buffers B1, B2. The resistors R10, R11 and the resistors R21, R21 may be selected such that they result in the impedance Z of each of the transmission lines from the device under test to the two lines 11, 12.

If the input voltages VT01, VT02 of the two buffers B1, B2 are selected such that the output voltages VT1, VT2 of the buffers B1, B2 are identical, and if the two switches SW1, SW2 are open, then the circuit 20 of FIG. 2 provides a differential signal operation with single-ended termination.

If the two buffers B1, B2 are in their high-impedance state and if the two switches SW1, SW2 are closed due to a high signal DT, the circuit 20 of FIG. 2 provides a differential signal operation with differential termination of the lines 11, 12. The diode bridge 21 and the comparator CD are active whereas the comparators CS1, CS2 are inactive.

In a further embodiment, the diode bridge 21 may also be used in its non-resistive region so that it acts as a so-called active or programmable load for one of the two lines 11, 12. In this case, the two switches SW1, SW2 are closed and e.g. the buffer B1 is set into its high-impedance state and the buffer B2 is set into its low-impedance state at a first voltage. If e.g. the line 11 carries a second voltage, then the voltage difference between the first and the second voltage is present at the diode bridge 21. As a result, the diode bridge 21 represents a load, which is programmable in particular with the first voltage and therefore the output voltage of the buffer B2.

Figure 3:
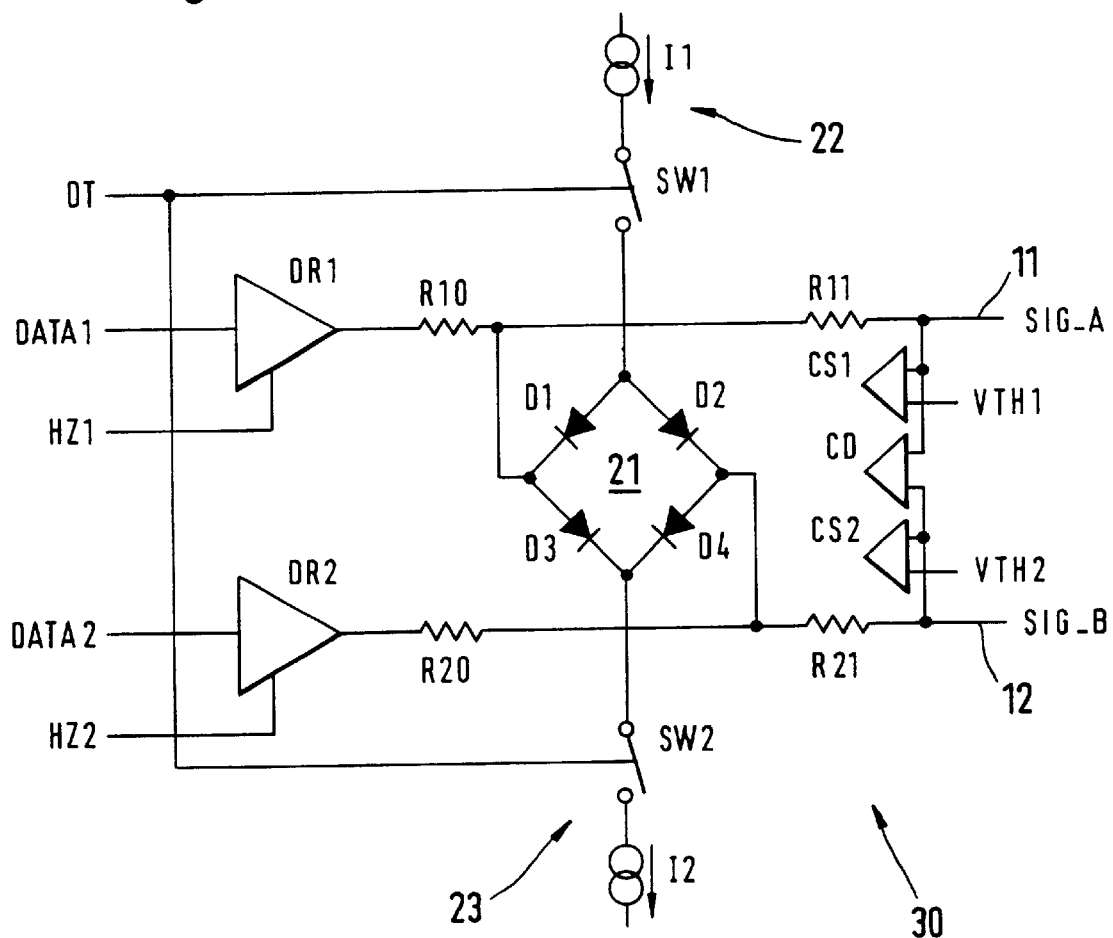
FIG. 3 shows a third embodiment of an electronic circuit according to the invention.

FIG. 3 shows a third embodiment of a pin-electronic circuit 30 of an automatic test equipment according to the invention. The circuit 30 of FIG. 3 is similar to the circuit 20 of FIG. 2. Therefore, corresponding features are depicted with the same reference characters.

In FIG. 3, the two buffers B1, B2 of FIG. 1 are replaced by two drivers DR1, DR2. Each of these drivers DR1, DR2 has an input, which may be programmed with a voltage DATA1, DATA2.

In a first mode, the voltages DATA1, DATA2 may be programmed identical to the voltages VT01, VT02 as described in connection with the circuit 20 of FIG. 2. In this mode, the drivers DR1, DR2 of the circuit 30 of FIG. 3 are used to establish a termination for the two lines 11, 12. This mode, therefore, is used for receiving the signals SIG_A, SIG_B on the lines 11, 12 from the device under test.

However, the two drivers DR1, DR2 may also be used to send signals via the two lines 11, 12 to the device under test, in particular a logical low level signal or a logical high level signal. In this mode, the inputs DATA1, DATA2 of the drivers DR1, DR2 are programmed as desired by a specific test program included in the automatic test equipment.

What is claimed is:

1. An electronic circuit for automatic test equipment for testing a device under test, comprising:

two lines for connecting two nodes of the circuit with the device under test;

two comparators, one input of each of the comparators being connected to different ones of the two nodes;

a further comparator, the two inputs of the further comparator being connected to different ones of the two nodes;

elements for terminating each of the two lines; and a switching element being coupled between the two nodes and to the elements for terminating such that the circuit can be switched between a single-ended termination and a differential termination.

2. The circuit according to claim 1, wherein the switching elements comprises a diode bridge serially connected to two switched current sources.

3. The circuit according to claim 2, wherein the switched current sources each comprise a serial connection of a current source and a switch.

4. The circuit according to claim 2, wherein the diode bridge is an active or programmable load.

5. The circuit according to claim 1, wherein the elements for terminating comprise a buffer and at least one resistor for each of the lines, and further wherein the output of the buffer is connected to said each of the lines via said at least one resistor.

6. The circuit according to claim 1, wherein the elements for terminating comprise a driver and at least one resistor for each of the lines, wherein the output of the driver is connected to said each of the lines via said at least one resistor.

7. The circuit according to claim 6, wherein the switching elements comprise a diode bridge serially connected to two switched current sources.

8. The circuit according to claim 7, wherein the diode bridge is connected between the two lines.

9. The circuit according to claim 8, wherein the elements for terminating comprise two resistors for each of the lines and further wherein the diode bridge is connected to the connection point of the two resistors of each of the lines.

10. The circuit according to claim 7, wherein the switched current sources each comprise a serial connection of a current source and a switch.

* * * * *